(12) United States Patent
Feng et al.

(10) Patent No.: US 11,288,993 B2
(45) Date of Patent: Mar. 29, 2022

(54) SHIFT REGISTER UNIT, DRIVING METHOD, GATE DRIVING CIRCUIT AND DISPLAY DEVICE (71) Applicants: HEFEI BOE JOINT TECHNOLOGY CO., LTD., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 86 days.

(21) Appl. No.: 16/963,444

(22) PCT Filed: Oct. 18, 2019

(86) PCT No.: PCT/CN2019/111907
§ 371 (c)(1),
(2) Date: Jul. 20, 2020

(87) PCT Pub. No.: WO2021/072734
PCT Pub. Date: Apr. 22, 2021

(65) Prior Publication Data
US 2021/0407358 A1 Dec. 30, 2021

(51) Int. Cl.
*G09G 3/20* (2006.01)
(52) U.S. Cl.
CPC ....... *G09G 3/20* (2013.01); *G09G 2300/0426* (2013.01); *G09G 2300/0842* (2013.01); *G09G 2310/0286* (2013.01); *G09G 2310/08* (2013.01)

(58) Field of Classification Search
CPC ......... G09G 2310/0286; G09G 3/3225; G09G 3/3266
See application file for complete search history.

(56) References Cited

U.S. PATENT DOCUMENTS 8,149,986 B2  4/2012  Tobita
2014/0064437 A1*  3/2014  Qi ........................ G11C 19/287
377/64

(Continued)

FOREIGN PATENT DOCUMENTS

CN  104021769 A  9/2014
CN  106128352 A  11/2016
(Continued)

*Primary Examiner* — Sepehr Azari
(74) *Attorney, Agent, or Firm* — Brooks Kushman P.C.

(57) ABSTRACT

A shift register unit includes a first node connection branch, an ON/OFF control circuit and a third node control circuit. A first end of the first node connection branch is electrically connected to first node, and a second end of the first node connection branch is electrically connected to a third node. The first node connection branch is configured to control the first node to be electrically connected to the third node under the control of a potential at the first node. The ON/OFF control circuit is configured to control the third node to be electrically connected to a first voltage end under the control of the potential at the first node. The third node control circuit is configured to reset a potential at the third node under the control of a resetting signal from a resetting end and a potential at a second node.

20 Claims, 5 Drawing Sheets (56) References Cited

U.S. PATENT DOCUMENTS

| | | | | |
|---|---|---|---|---|
| 2014/0267214 | A1* | 9/2014 | Hwang | G09G 3/2092 345/212 |
| 2015/0317954 | A1* | 11/2015 | Jang | G09G 5/18 345/213 |
| 2015/0371599 | A1* | 12/2015 | Xiao | G09G 3/36 345/212 |
| 2016/0266699 | A1 | 9/2016 | Zhao et al. | |
| 2018/0196563 | A1* | 7/2018 | Iwase | G06F 3/0412 |
| 2019/0180707 | A1* | 6/2019 | Shi | G09G 3/3677 |
| 2020/0027516 | A1 | 1/2020 | Feng | |
| 2020/0135286 | A1* | 4/2020 | Li | G09G 3/3225 |
| 2021/0201807 | A1* | 7/2021 | Feng | G09G 3/3266 |

FOREIGN PATENT DOCUMENTS

| | | |
|---|---|---|
| CN | 108877682 A | 11/2018 |
| CN | 109192171 A | 1/2019 |
| CN | 109935187 A | 6/2019 |

* cited by examiner

SHIFT REGISTER UNIT, DRIVING METHOD, GATE DRIVING CIRCUIT AND DISPLAY DEVICE

CROSS REFERENCE TO RELATED APPLICATION

This application is the U.S. national phase of PCT Application No. PCT/CN2019/111907 filed on Oct. 18, 2019, which is incorporated herein by reference in its entirety.

TECHNICAL FIELD

The present disclosure relates to the field of display driving technology, in particular to a shift register unit, a driving method, a gate driving circuit and a display device.

BACKGROUND

In the field of display technology, as an effective measure, a Gate On Array (GOA) circuit is used to prevent the occurrence of defects for a display panel and reduce the manufacture cost. A core concept of the GOA circuit is to simplify a circuit and narrow a bezel while ensuring the performance.

SUMMARY

In one aspect, the present disclosure provides in some embodiments a shift register unit, including a first node connection branch, an ON/OFF control circuit and a third node control circuit. A first end of the first node connection branch is electrically connected to a first node, a second end of the first node connection branch is electrically connected to a third node, and the first node connection branch is configured to control the first node to be electrically connected to the third node under the control of a potential at the first node. The ON/OFF control circuit is electrically connected to the first node, the third node and a first voltage end, and configured to control the third node to be electrically connected to the first voltage end under the control of the potential at the first node. The third node control circuit is electrically connected to a resetting end, the third node and a second node, and configured to reset a potential at the third node under the control of a resetting signal from the resetting end and a potential at the second node.

In some possible embodiments of the present disclosure, the first node connection branch includes a first node connection transistor, a control electrode and a first electrode of which are electrically connected to the first end of the first node connection branch, and a second electrode of which is electrically connected to the second end of the first node connection branch.

In some possible embodiments of the present disclosure, the ON/OFF control circuit includes an ON/OFF control transistor, a control electrode of which is electrically connected to the first node, a first electrode of which is electrically connected to the first voltage end, and a second electrode of which is electrically connected to the third node.

In some possible embodiments of the present disclosure, the third node control circuit includes a first control transistor and a second control transistor. A control electrode of the first control transistor is electrically connected to the resetting end, a first electrode of the first control transistor is electrically connected to the third node, and a second electrode of the first control transistor is electrically connected to a second voltage end. A control electrode of the second control transistor is electrically connected to the second node, a first electrode of the second control transistor is electrically connected to the third node, and a second electrode of the second control transistor is electrically connected to the second voltage end.

In some possible embodiments of the present disclosure, the third node control circuit includes a first control transistor, a second control transistor and a third control transistor. A control electrode of the first control transistor is electrically connected to the resetting end, a first electrode of the first control transistor is electrically connected to the third node, and a second electrode of the first control transistor is electrically connected to a second voltage end. A control electrode of the second control transistor is electrically connected to the second node, a first electrode of the second control transistor is electrically connected to the third node, and a second electrode of the second control transistor is electrically connected to the second voltage end. A control electrode of the third control transistor is electrically connected to the second node, a first electrode of the third control transistor is electrically connected to the first node, and a second electrode of the third control transistor is electrically connected to the third node.

In some possible embodiments of the present disclosure, the third node control circuit is further configured to reset the potential at the third node under the control of a frame resetting signal from a frame resetting end.

In some possible embodiments of the present disclosure, the shift register unit further includes a first node control circuit, a second node control circuit, a storage capacitor, a gate driving signal output end and a gate driving signal output circuit. The first node control circuit is configured to control the potential at the first node under the control of an input signal from an input end. The second node control circuit is configured to control the potential at the second node under the control of the potential at the first node. The storage capacitor is connected between the first node and the gate driving signal output end. The gate driving signal output circuit is configured to control the gate driving signal output end to be electrically connected to a first clock signal end under the control of the potential at the first node and reset a gate driving signal outputted by the gate driving signal output end under the control of the potential at the second node.

In some possible embodiments of the present disclosure, the shift register unit further includes a carry signal output end and a carry signal output circuit. The carry signal output circuit is configured to control the carry signal output end to be electrically connected to a second clock signal end under the control of the potential at the first node and reset a carry signal outputted by the carry signal output end under the control of the potential at the second node.

In some possible embodiments of the present disclosure, the first node control circuit includes a first node control transistor, the second node control circuit includes a second node control transistor, and the gate driving signal output circuit includes a first gate driving signal output transistor and a second gate driving signal output transistor. A control electrode of the first node control transistor is electrically connected to the input end, a first electrode of the first node control transistor is electrically connected to a first voltage end, and a second electrode of the first node control transistor is electrically connected to the first node. A control electrode of the second node control transistor is electrically connected to the first node, a first electrode of the second node control transistor is electrically connected to the sec-ond node, and a second electrode of the second node control transistor is electrically connected to a second voltage end. A control electrode of the first gate driving signal output transistor is electrically connected to the first node, a first electrode of the first gate driving signal output transistor is electrically connected to the first clock signal end, and a second electrode of the first gate driving signal output transistor is electrically connected to the gate driving signal output end. A control electrode of the second gate driving signal output transistor is electrically connected to the second node, a first electrode of the second gate driving signal output transistor is electrically connected to the gate driving signal output end, and a second electrode of the second gate driving signal output transistor is electrically connected to the second voltage end.

In some possible embodiments of the present disclosure, the carry signal output circuit includes a first carry signal output transistor and a second carry signal output transistor. A control electrode of the first carry signal output transistor is electrically connected to the first node, a first electrode of the first carry signal output transistor is electrically connected to the second clock signal end, and a second electrode of the first carry signal output transistor is electrically connected to the carry signal output end. A control electrode of the second carry signal output transistor is electrically connected to the second node, a first electrode of the second carry signal output transistor is electrically connected to the carry signal output end, and a second electrode of the second carry signal output transistor is electrically connected to the second voltage end.

In another aspect, the present disclosure provides in some embodiments a method for driving the above-mentioned shift register unit, including, at an input stage and an output stage of a display device, controlling, by the first node connection branch, the first node to be electrically connected to the third node under the control of a potential at the first node, and controlling, by the ON/OFF control circuit, the third node to be electrically connected to the first voltage end under the control of the potential at the first node.

In yet another aspect, the present disclosure provides in some embodiments a gate driving circuit including multi-levels of the above-mentioned shift register units.

In still yet another aspect, the present disclosure provides in some embodiments a display device including the above-mentioned gate driving circuit.

According to the shift register unit, the driving method, the gate driving circuit and the display device in the embodiments of the present disclosure, merely through changing a connection relationship of the first node connection branch, it is able to prevent the occurrence of current leakage through the ON/OFF control circuit, prevent the potential at the first node from being reduced, and maintain the potential at the first node as an active voltage in a better manner at the input stage and the output stage than conventional, thereby to output the gate driving signal normally. In addition, it is able to reduce the number of the transistors, thereby to provide a narrow bezel.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
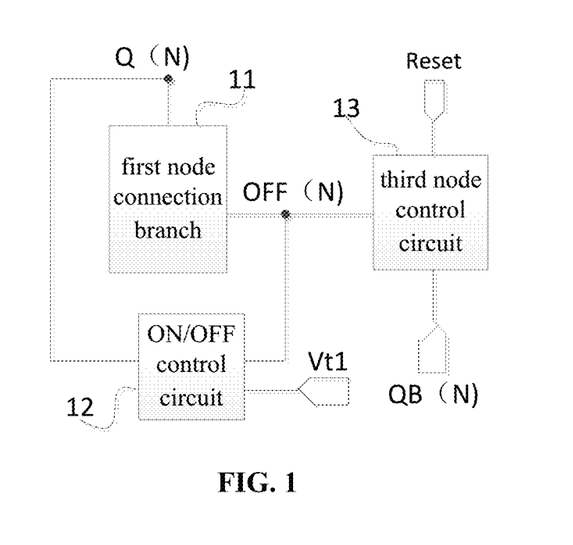
FIG. 1 is a schematic view showing a shift register unit according to some embodiments of the present disclosure.

As shown in FIG. 1, the present disclosure provides in some embodiments a shift register unit which includes a first node connection branch 11, an ON/OFF control circuit 12 and a third node control circuit 13. A first end of the first node connection branch 11 is electrically connected to a first node Q(N), a second end of the first node connection branch 11 is electrically connected to a third node OFF(N), and the first node connection branch 11 is configured to control the first node Q(N) to be electrically connected to the third node OFF(N) under the control of a potential at the first node Q(N). The ON/OFF control circuit 12 is electrically connected to the first node Q(N), the third node OFF(N) and a first voltage end Vt1, and configured to control the third node OFF(N) to be electrically connected to the first voltage end Vt1 under the control of the potential at the first node Q(N). The third node control circuit 13 is electrically connected to a resetting end Reset, the third node OFF(N) and a second node QB(N), and configured to reset a potential at the third node OFF(N) under the control of a resetting signal from the resetting end Reset and a potential at the second node QB(N).

During the implementation, the first voltage Vt1 may be, but not limited to, a high voltage end.

In some embodiments of the present disclosure, when transistors of the shift register unit are N-type transistors, the first node Q(N) may be, but not limited to, a pull-up node, and the second node QB(N) may be, but not limited to, a pull-down node.

In some embodiments of the present disclosure, when transistors of the shift register unit are P-type transistors, the first node Q(N) may be, but not limited to, a pull-down node, and the second node QB(N) may be, but not limited to, a pull-up node.

According to the embodiments of the present disclosure, through changing a connection relationship of the first node connection branch 11, the first end of the first node connection branch 11 may be electrically connected to the first node Q(N), so as to, on the premise of reducing the number of the transistors, reduce an absolute value of a difference between the potential at the first node Q(N) and a first voltage applied by the first voltage end Vt1 when the ON/OFF control circuit 12 controls the third node OFF(N) to be electrically connected to the first voltage end Vt1, and prevent the difference between the potential at the first node Q(N) and the first voltage from being too large, thereby to reduce a leakage current flowing through the first node connection branch 11.

In the related art, the potential at the first node needs to be maintained to prevent the occurrence of leakage current, and a large number of the transistors needs to be provided, so it is adverse to a narrow bezel. Based on this, according to the shift register unit in the embodiments of the present disclosure, merely through changing the connection relationship of the first node connection branch 11, it is able prevent the occurrence of current leakage, prevent the potential at the pull-up node from being reduced, and maintain the potential at the first node as an active voltage in a better manner at an input stage and an output stage, thereby to output the gate driving signal normally. In addition, it is able to reduce the number of the transistors, thereby to provide a narrow bezel.

During the operation of the shift register unit in the embodiments of the present disclosure, at the input stage and the output stage, the first node connection branch 11 may control the first node Q(N) to be electrically connected to the third node OFF(N) under the control of the potential at the first node Q(N), and the ON/OFF control circuit 12 may control the third node OFF(N) to be electrically connected to the first voltage end Vt1 under the control of the potential at the first node Q(N), so as to reduce the leakage current flowing through the first node connection branch 11, maintain the potential at the first node Q(N) as an active voltage, and enable a first gate driving signal output transistor of the gate driving signal output circuit to be turned on (a gate electrode of the first gate driving signal output transistor is electrically connected to the first node Q(N)), thereby to output a gate driving signal normally.

In some embodiments of the present disclosure, the active voltage may be a voltage capable of controlling the first gate driving signal output transistor to be turned on. For example, when the first gate driving signal output transistor is an N-type transistor, the active voltage may be a high voltage.

To be specific, the first node connection branch may include a first node connection transistor, a control electrode and a first electrode of which may be electrically connected to the first end of the first node connection branch, and a second electrode of which may be electrically connected to the second end of the first node connection branch.

Figure 2:
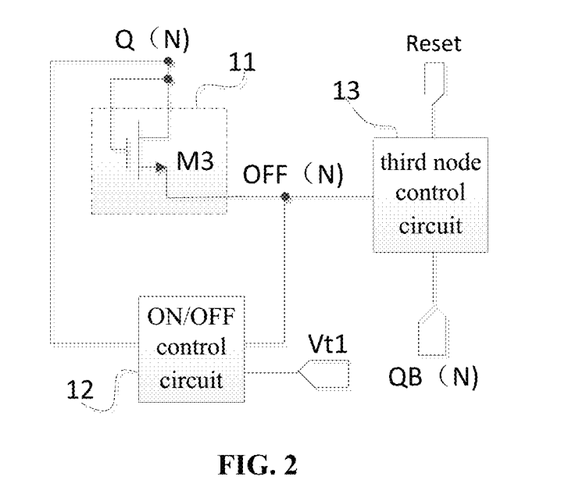
FIG. 2 is another schematic view showing the shift register unit according to some embodiments of the present disclosure.

As shown in FIG. 2, on the basis of the shift register unit in FIG. 1, the first node connection branch 11 may include a first node connection transistor M3, a gate electrode and a drain electrode of which are electrically connected to the first node Q(N), and a source electrode of which is electrically connected to the third node OFF(N).

In the shift register unit in FIG. 2, M3 may be, but not limited to, an N-type thin film transistor (TFT).

During the operation of the shift register unit in FIG. 2, at the input stage and the output stage, the potential at Q(N) may be a high level. The ON/OFF control circuit 12 may control the third node OFF(N) to be electrically connected to the first voltage end Vt1 under the control of the potential at the first node Q(N), so as to enable the potential at OFF(N) to be the first voltage applied by the first voltage end Vt1. The difference between the first voltage and the potential at Q(N) may be set to be small, so as to reduce the leakage current flowing through M3, and ensure that the potential at Q(N) is a high level.

To be specific, the ON/OFF control circuit may include an ON/OFF control transistor, a control electrode of which is electrically connected to the first node, a first electrode of which is electrically connected to the first voltage end, and a second electrode of which is electrically connected to the third node.

Figure 3:
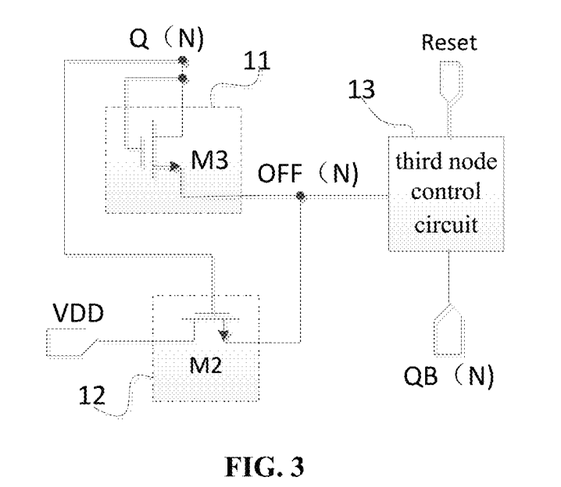
FIG. 3 is yet another schematic view showing the shift register unit according to some embodiments of the present disclosure.

As shown in FIG. 3, on the basis of the shift register unit in FIG. 2, the ON/OFF control circuit 12 may include an ON/OFF control transistor M2, a gate electrode of which is electrically connected to the first node Q(N), a drain electrode of which is electrically connected to a high voltage end, and a source electrode of which is electrically connected to the third node OFF(N). The high voltage end is configured to apply a high voltage VDD.

In the shift register unit in FIG. 3, M2 may be, but not limited to, an N-type TFT, and the first voltage end may be, but not limited to, a high voltage end.

During the operation of the shift register unit in FIG. 3, at the input stage and the output stage, the potential at Q(N) may be a high level, so as to turn on M2 to control the potential at OFF(N) to a high voltage, thereby to reduce an absolute value of a difference between a potential at the drain electrode of M3 and a potential at the source electrode of M3, and reduce the leakage current flowing through M3.

In some possible embodiments of the present disclosure, the third node control circuit may include a first control transistor and a second control transistor. A control electrode of the first control transistor may be electrically connected to the resetting end, a first electrode of the first control transistor may be electrically connected to the third node, and a second electrode of the first control transistor may be electrically connected to a second voltage end. A control electrode of the second control transistor may be electrically connected to the second node, a first electrode of the second control transistor may be electrically connected to the third node, and a second electrode of the second control transistor may be electrically connected to the second voltage end.

In some embodiments of the present disclosure, the second voltage end may be, but not limited to, a low voltage end.

Figure 4:
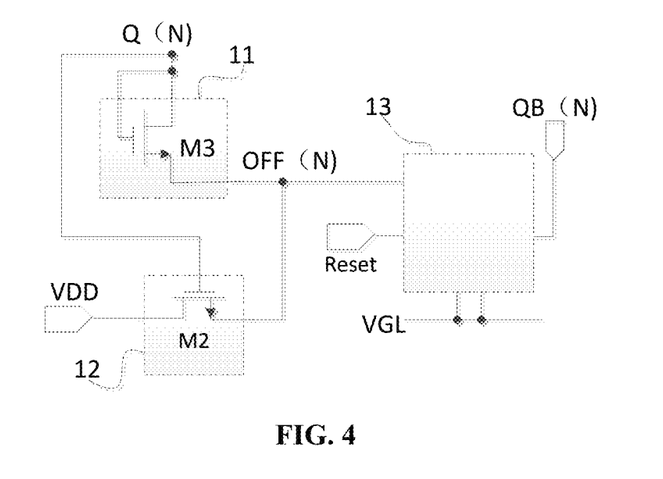
FIG. 4 is still yet another schematic view showing the shift register unit according to some embodiments of the present disclosure.

As shown in FIG. 4, on the basis of the shift register unit in FIG. 3, the third node control circuit 13 may include a first control transistor M6 and a second control transistor M8. A gate electrode of the first control transistor M6 may be electrically connected to the resetting end Reset, a drain electrode of the first control transistor M6 may be electrically connected to the third node OFF(N), and a source electrode of the first control transistor M6 may be electrically connected to the low voltage end. The low voltage end is configured to provide a low voltage VGL, for example. A gate electrode of the second control transistor M8 may be electrically connected to the second node QB(N), a drain electrode of the second control transistor M8 may be electrically connected to the third node OFF(N), and a source electrode of the second control transistor M8 may be electrically connected to the low voltage end.

In the shift register unit in FIGS. 4, M6 and M8 may each be, but not limited to, an N-type TFT, and the second voltage end may be, but not limited to, a low voltage end.

During the operation of the shift register unit in FIG. 4, at a resetting stage, a high voltage may be applied to Reset, so as to turn on M6 to control the potential at OFF(N) to be a low voltage, and turn on M3 to pull down the potential at Q(N) to be a low voltage until M3 is turned off.

In addition, at the resetting stage and an output cutoff maintenance stage, the potential at QB(N) may be a high voltage, and the potential at Q(N) may be a low voltage, so as to turn on M8, thereby to enable the potential at OFF(N) to be a low voltage.

In another possible embodiment of the present disclosure, the third node control circuit may include a first control transistor, a second control transistor and a third control transistor. A control electrode of the first control transistor may be electrically connected to the resetting end, a first electrode of the first control transistor may be electrically connected to the third node, and a second electrode of the first control transistor may be electrically connected to a second voltage end. A control electrode of the second control transistor may be electrically connected to the second node, a first electrode of the second control transistor may be electrically connected to the third node, and a second electrode of the second control transistor may be electrically connected to the second voltage end. A control electrode of the third control transistor may be electrically connected to the second node, a first electrode of the third control transistor may be electrically connected to the first node, and a second electrode of the third control transistor may be electrically connected to the third node.

Figure 5:
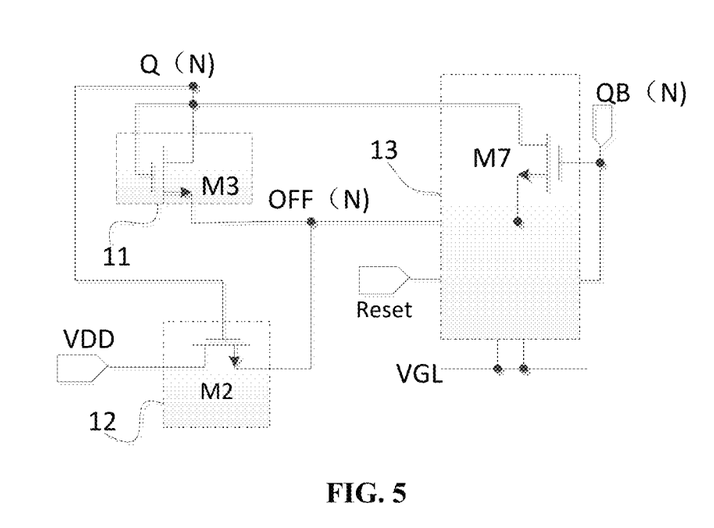
FIG. 5 is still yet another schematic view showing the shift register unit according to some embodiments of the present disclosure.

As shown in FIG. 5, on the basis of the shift register unit in FIG. 3, the third node control circuit 13 may include a first control transistor M6, a second control transistor M8 and a third control transistor M7. A gate electrode of the first control transistor M6 may be electrically connected to the resetting end Reset, a drain electrode of the first control transistor M6 may be electrically connected to the third node OFF(N), and a source electrode of the first control transistor M6 may be electrically connected to a low voltage end which is configured to apply a low voltage VGL. A gate electrode of the second control transistor M8 may be electrically connected to the second node QB(N), a drain electrode of the second control transistor M8 may be electrically connected to the third node OFF(N), and a source electrode of the second control transistor M8 may be electrically connected to the low voltage end. A gate electrode of the third control transistor M7 may be electrically connected to the second node QB(N), a drain electrode of the third control transistor M7 may be electrically connected to the first node Q(N), and a source electrode of the third control transistor M7 may be electrically connected to the third node OFF(N).

In the shift register unit in FIG. 5, M6, M7 and M8 may each be, but not limited to, an N-type TFT, and the second voltage end may be, but not limited to, a low voltage end.

During the operation of the shift register unit in FIG. 5, at the resetting stage, a high voltage may be applied to Reset, so as to turn on M6 to control the potential at OFF(N) to be a low voltage, and turn on M3 to pull down the potential at Q(N) to a low voltage until M3 is turned off.

In addition, at the resetting stage and the output cutoff maintenance stage, the potential at QB(N) may be a high voltage, and the potential at Q(N) may be a low voltage, so as to turn on M7 and M8, thereby to enable the potential at OFF(N) to be a low voltage.

To be specific, the third node control circuit is further configured to reset the potential at the third node under the control of a frame resetting signal from a frame resetting end.

During the implementation, the potential at the third node may be reset under the control of the frame resetting signal from the frame resetting end when each frame is ended.

In some embodiments of the present disclosure, the shift register unit may further include a first node control circuit, a second node control circuit, a storage capacitor, a gate driving signal output end and a gate driving signal output circuit. The first node control circuit is configured to control the potential at the first node under the control of an input signal from an input end. The second node control circuit is configured to control the potential at the second node under the control of the potential at the first node. The storage capacitor may be connected between the first node and the gate driving signal output end. The gate driving signal output circuit is configured to control the gate driving signal output end to be electrically connected to a first clock signal end under the control of the potential at the first node and reset a gate driving signal outputted by the gate driving signal output end under the control of the potential at the second node.

During the implementation, the first node control circuit may control the potential at the first node under the control of the input signal, the second node control circuit may control the potential at the second node under the control of the potential at the first node, and the gate driving signal output circuit may control the gate driving signal output end to output a corresponding gate driving signal under the control of the potential at the first node and the potential at the second node.

Figure 6:
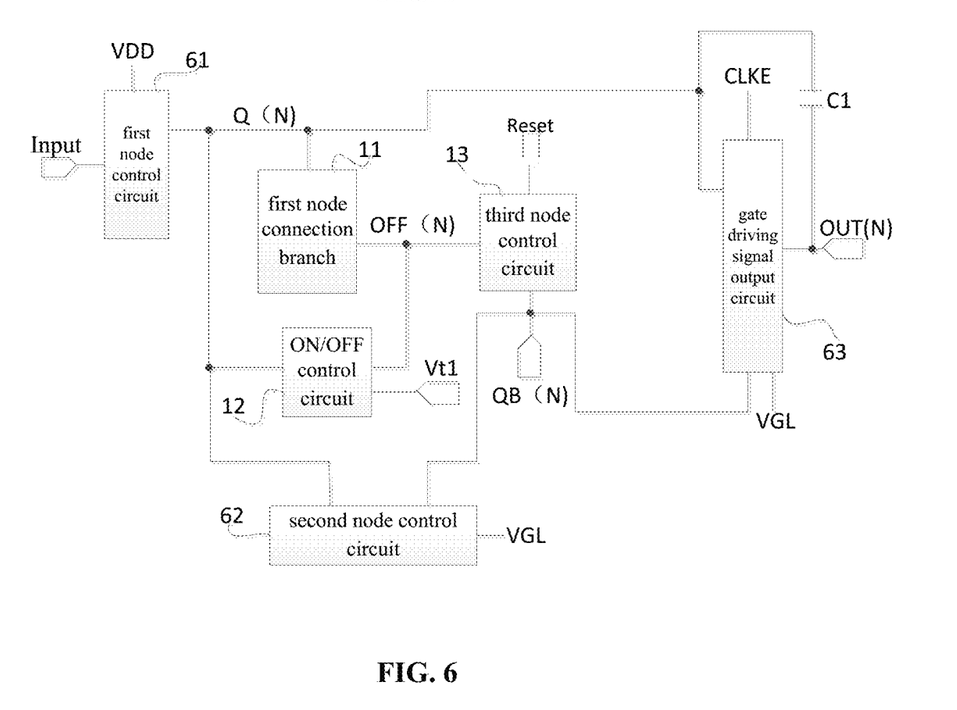
FIG. 6 is still yet another schematic view showing the shift register unit according to some embodiments of the present disclosure.

As shown in FIG. 6, on the basis of the shift register unit in FIG. 1, the shift register unit may further include a first node control circuit 61, a second node control circuit 62, a storage capacitor C1, a gate driving signal output end OUT(N) and a gate driving signal output circuit 63. The first node control circuit 61 may be electrically connected to an input end Input, the first node Q(N) and a high voltage end, and it is configured to control the first node Q(N) to be electrically connected to the high voltage end under the control of an input signal from the input end Input. The high voltage end is configured to apply a high voltage VDD. The second node control circuit 62 may be electrically connected to the first node Q(N), the second node QB(N) and a low voltage end, and it is configured to control the second node QB(N) to be electrically connected to the low voltage end under the control of the potential at the first node Q(N). The low voltage end is configured to apply a low voltage VGL. The storage capacitor C1 may be connected between the first node Q(N) and the gate driving signal output end OUT(N). The gate driving signal output circuit 63 may be connected to the first node Q(N), the gate driving signal output end OUT(N), a first clock signal end CLKE, the second node QB(N) and the low voltage end, and it is configured to control the gate driving signal output end OUT(N) to be electrically connected to the first clock signal end CLKE under the control of the potential at the first node Q(N), and control the gate driving signal output end OUT(N) to be electrically connected to the low voltage end under the control of the potential at the second node QB(N) to reset a gate driving signal outputted by the gate driving signal output end OUT(N).

In some possible embodiments of the present disclosure, the shift register unit may further include a carry signal output end and a carry signal output circuit. The carry signal output circuit is configured to control the carry signal output end to be electrically connected to a second clock signal end under the control of the potential at the first node and reset a carry signal outputted by the carry signal output end under the control of the potential at the second node.

During the implementation, the shift register unit may further include the carry signal output end and the carry signal output circuit. The carry signal output end may be cascaded to the other level of shift register unit, so as to increase a driving capability of the gate driving signal output end.

Figure 7:
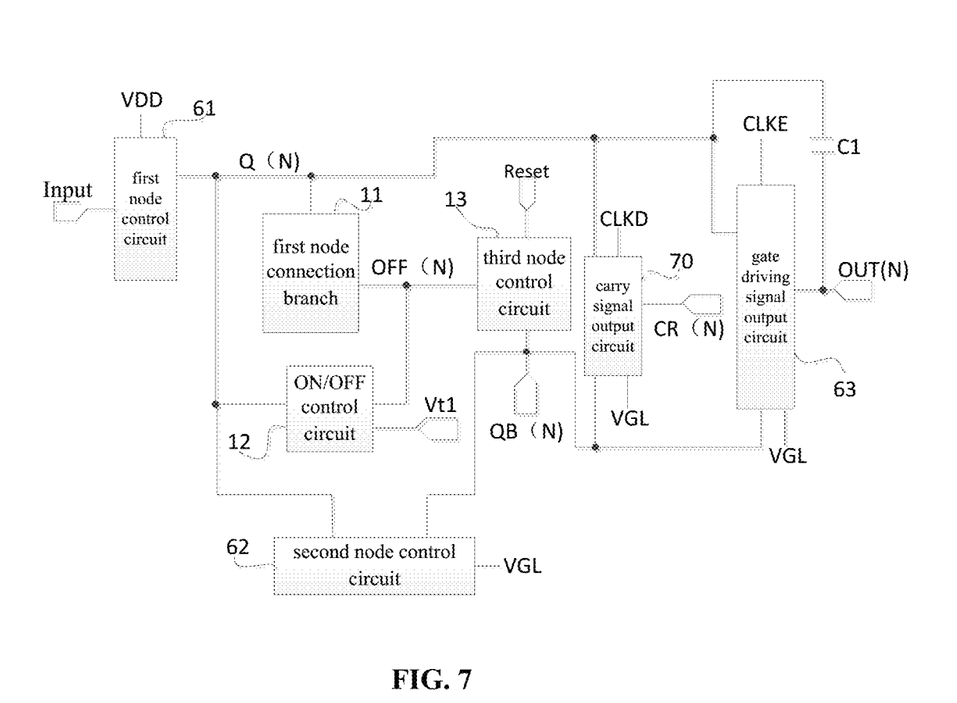
FIG. 7 is still yet another schematic view showing the shift register unit according to some embodiments of the present disclosure.

As shown in FIG. 7, on the basis of the shift register unit in FIG. 6, the shift register unit may further include a carry signal output end CR(N) and a carry signal output circuit 70. The carry signal output circuit 70 may be connected to the first node Q(N), the second node QB(N), a second clock signal end CLKD, the carry signal output end CR(N) and the low voltage end, and it is configured to control the carry signal output end CR(N) to be electrically connected to the second clock signal end CLKD under the control of the potential at the first node Q(N), and control the carry signal output end CR(N) to be electrically connected to the low voltage end under the control of the potential at the second node QB(N) to reset a carry signal outputted by the carry signal output end CR(N). The low voltage end is configured to apply a low voltage VGL.

To be specific, the first node control circuit may include a first node control transistor, the second node control circuit may include a second node control transistor, and the gate driving signal output circuit may include a first gate driving signal output transistor and a second gate driving signal output transistor. A control electrode of the first node control transistor may be electrically connected to the input end, a first electrode of the first node control transistor may be electrically connected to a first voltage end, and a second electrode of the first node control transistor may be electrically connected to the first node. A control electrode of the second node control transistor may be electrically connected to the first node, a first electrode of the second node control transistor may be electrically connected to the second node, and a second electrode of the second node control transistor may be electrically connected to a second voltage end. A control electrode of the first gate driving signal output transistor may be electrically connected to the first node, a first electrode of the first gate driving signal output transistor may be electrically connected to the first clock signal end, and a second electrode of the first gate driving signal output transistor may be electrically connected to the gate driving signal output end. A control electrode of the second gate driving signal output transistor may be electrically connected to the second node, a first electrode of the second gate driving signal output transistor may be electrically connected to the gate driving signal output end, and a second electrode of the second gate driving signal output transistor may be electrically connected to the second voltage end.

In some embodiments of the present disclosure, the first voltage end may be, but not limited to, a high voltage end, and the second voltage end may be, but not limited to, a low voltage end.

To be specific, the carry signal output circuit may include a first carry signal output transistor and a second carry signal output transistor. A control electrode of the first carry signal output transistor may be electrically connected to the first node, a first electrode of the first carry signal output transistor may be electrically connected to the second clock signal end, and a second electrode of the first carry signal output transistor may be electrically connected to the carry signal output end. A control electrode of the second carry signal output transistor may be electrically connected to the second node, a first electrode of the second carry signal output transistor may be electrically connected to the carry signal output end, and a second electrode of the second carry signal output transistor may be electrically connected to the second voltage end.

In some embodiments of the present disclosure, the second voltage end may be, but not limited to, a low voltage end.

Figure 8:
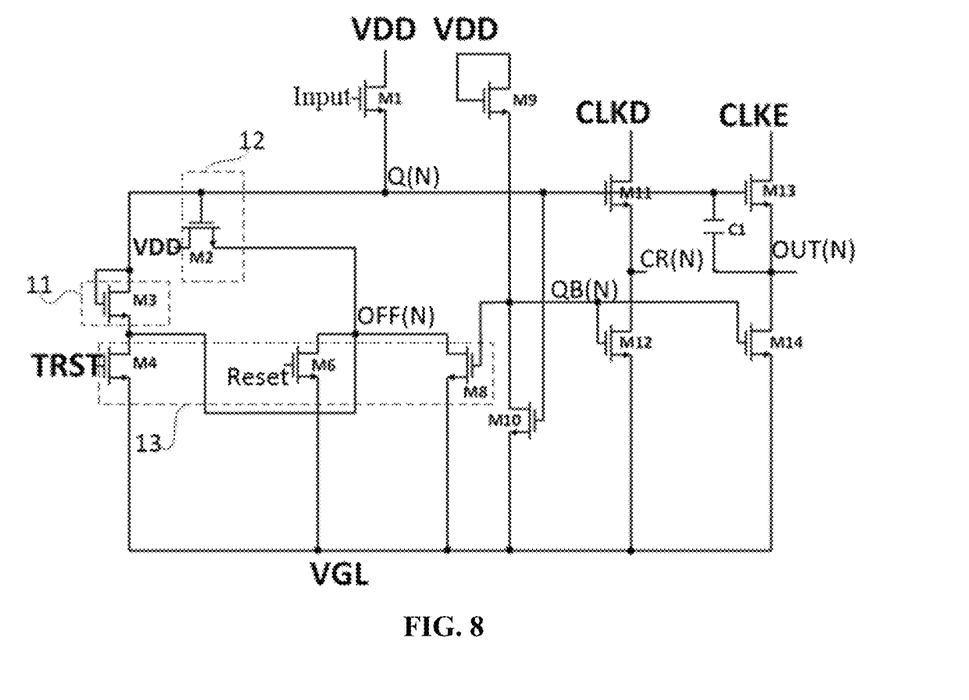
FIG. 8 is a circuit diagram of the shift register unit according to some embodiments of the present disclosure.

As shown in FIG. 8, the shift register unit in the embodiments of the present disclosure may include a first node connection branch 11, an ON/OFF control circuit 12, a third node control circuit 13, a first node control circuit, a second node control circuit, a storage capacitor C1, a gate driving signal output end OUT(N), a gate driving signal output circuit, a carry signal output end CR(N) and a carry signal output circuit. The first node connection branch 11 may include a first node connection transistor M3, a gate electrode and a drain electrode of which are electrically connected to the first node Q(N), and a source electrode of which is electrically connected to the third node OFF(N).

The ON/OFF control circuit 12 may include an ON/OFF control transistor M2, a gate electrode of which is electrically connected to the first node Q(N), a drain electrode of which is electrically connected to a high voltage end, and a source electrode of which is electrically connected to the third node OFF(N). The high voltage end is configured to apply a high voltage VDD.

The third node control circuit 13 may include a first control transistor M6, a second control transistor M8 and an OFF control transistor M4. A gate electrode of the first control transistor M6 may be electrically connected to the reset end Reset, a drain electrode of the first control transistor M6 may be electrically connected to the third node OFF(N), and a source electrode of the first control transistor M6 may be electrically connected to a low voltage end which is configured to apply a low voltage VGL. A gate electrode of the second control transistor M8 may be electrically connected to the second node QB(N), a drain electrode of the second control transistor M8 may be electrically connected to the third node OFF(N), and a source electrode of the second control transistor M8 may be electrically connected to the low voltage end. A gate electrode of the OFF control transistor M4 may be electrically connected to a frame resetting end TRST, a drain electrode of the OFF control transistor M4 may be electrically connected to third node OFF(N), and a source electrode of the OFF control transistor M4 may be electrically connected to the low voltage end.

The first node control circuit may include a first node control transistor M1, the second node control circuit may include a second node control transistor M10, and the gate driving signal output circuit may include a first gate driving signal output transistor M13 and a second gate driving signal output transistor M14. A gate electrode of the first node control transistor M1 may be electrically connected to the input end Input, a drain electrode of the first node control transistor M1 may be electrically connected to the high voltage end, and a source electrode of the first node control transistor M1 may be electrically connected to the first node Q(N). A gate electrode of the second node control transistor M10 may be electrically connected to the first node Q(N), a drain electrode of the second node control transistor M10 may be electrically connected to the second node QB(N), and a source electrode of the second node control transistor M10 may be electrically connected to the low voltage end. A gate electrode of the first gate driving signal output transistor M13 may be electrically connected to the first node Q(N), a drain electrode of the first gate driving signal output transistor M13 may be electrically connected to the first clock signal end CLKE, and a source electrode of the first gate driving signal output transistor M13 may be electrically connected to the gate driving signal output end OUT(N). A gate electrode of the second gate driving signal output transistor M14 may be electrically connected to the second node QB(N), a drain electrode of the second gate driving signal output transistor M14 may be electrically connected to the gate driving signal output end OUT(N), and a source electrode of the second gate driving signal output transistor M14 may be electrically connected to the low voltage end.

The storage capacitor C1 may be connected between the first node Q(N) and the gate driving signal output end OUT(N).

The carry signal output circuit may include a first carry signal output transistor M11 and a second carry signal output transistor M12. A gate electrode of the first carry signal output transistor M11 may be electrically connected to the first node Q(N), a drain electrode of the first carry signal output transistor M11 may be electrically connected to the second clock signal end CLKD, and a source electrode of the first carry signal output transistor M11 may be electrically connected to the carry signal output end CR(N). A gate electrode of the second carry signal output transistor M12 may be electrically connected to the second node QB(N), a drain electrode of the second carry signal output transistor M12 may be electrically connected to the carry signal output end CR(N), and a source electrode of the second carry signal output transistor M12 may be electrically connected to the low voltage end.

In the shift register unit in FIG. 8, all the transistors may be, but not limited to, N-type TFTs.

In the shift register unit in FIG. 8, the first node may be, but not limited to, a pull-up node, and the second node may be, but not limited to, a pull-down node.

In the shift register unit in FIG. 8, through M2 and M3, it is able to prevent the potential at Q(N) from being pulled down due to the current leakage, thereby to reduce the number of the transistors and provide a narrow bezel.

In the shift register unit in FIG. 8, Input may be electrically connected to an $(N-2)^{th}$-level carry signal output end CR(N−2), Reset may be electrically connected to an $(N+4)^{th}$-level carry signal output end CR(N+4), where N is a positive integer. When N is smaller than 3, Input may be electrically connected to a start end for applying a start signal.

The following description will be given when the shift register unit in FIG. 8 is a seventh-level shift register unit of a gate driving circuit, i.e., N=7.

Figure 9:
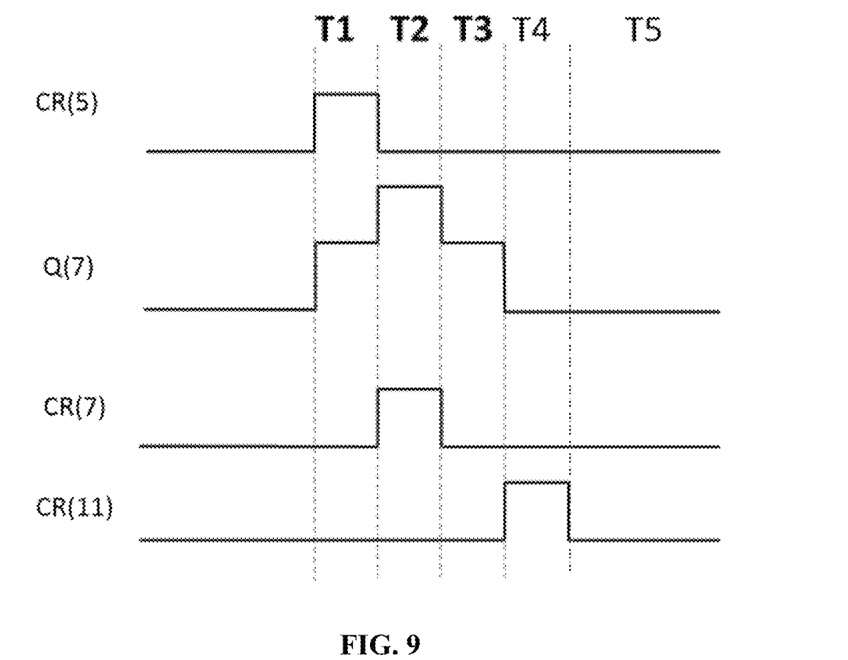
FIG. 9 is a sequence diagram of the shift register unit in FIG. 8.

As shown in FIG. 9, during the operation of the shift register unit in FIG. 8, a display period may include an input stage T1, an output stage T2, an output resetting stage T3, a resetting stage T4 and an output cutoff maintenance stage T5 arranged one after another.

At the input stage T1, a high level may be applied to CR(5), a low level may be applied to CR(11), and a low level may be applied to each of CLKD and CLKE. At this time, M1 may be turned on, so as to pull up a potential at Q(7) to a high level. M10 may be turned on, so as to pull down a potential at QB(N). M2 may be turned on, so as to enable the potential at OFF(N) to be a high level, and enable each of a potential at the source electrode of M3 and a potential at the drain electrode of M3 to be a high level, thereby to reduce a leakage current for M3 and maintain the potential at Q(7) to be a high level. M11 and M13 may be turned on, so as to control OUT(7) and CR(7) to each output a low level.

At the output stage T2, a low level may be applied to each of CR(5) and CR(11), and a high level may be applied to each of CLKD and CLKE. At this time, due to C1, the potential at Q(7) may be maintained as a high level. M11 and M13 may be turned on, so as to control OUT(7) and CR(7) to each output a high level.

At the output resetting stage T3, a low level may be applied to each of CR(5) and CR(11), and a low level may be applied to each of CLKD and CLKE. At this time, the potential at Q(N) may be maintained as a high level, and M11 and M13 may be turned on so as to control OUT(7) and CR(7) to each output a low level.

At the resetting stage T4, a low level may be applied to CR(5), and a high level may be applied to CR(11). At this time, M6 may be turned on, so as to control the potential at OFF(7) to be a low level. M3 may be turned on, so as to pull down the potential at Q(N) to a low voltage until M3 is turned off. M9 may be turned on and M10 may be turned off, so as to pull up the potential at QB(N). M11 and M13 may be turned off, and M12 and M14 may be turned on, so CR(7) and OUT(7) may each output a low level. M8 may be turned on, so as to maintain the potential at OFF(7) to be a low level.

At the output cutoff maintenance stage T5, a low level may be applied to CR(5), and a high level may be applied to CR(11). At this time, the potential at Q(7) may be maintained as a low level, and the potential at QB(7) may be maintained as a high level. M11 and M13 may be turned off, and M12 and M14 may be turned on, so CR(7) and OUT(7) may each output a low level. M8 may be turned on, so as to maintain the potential at OFF(7) as a low level.

Figure 10:
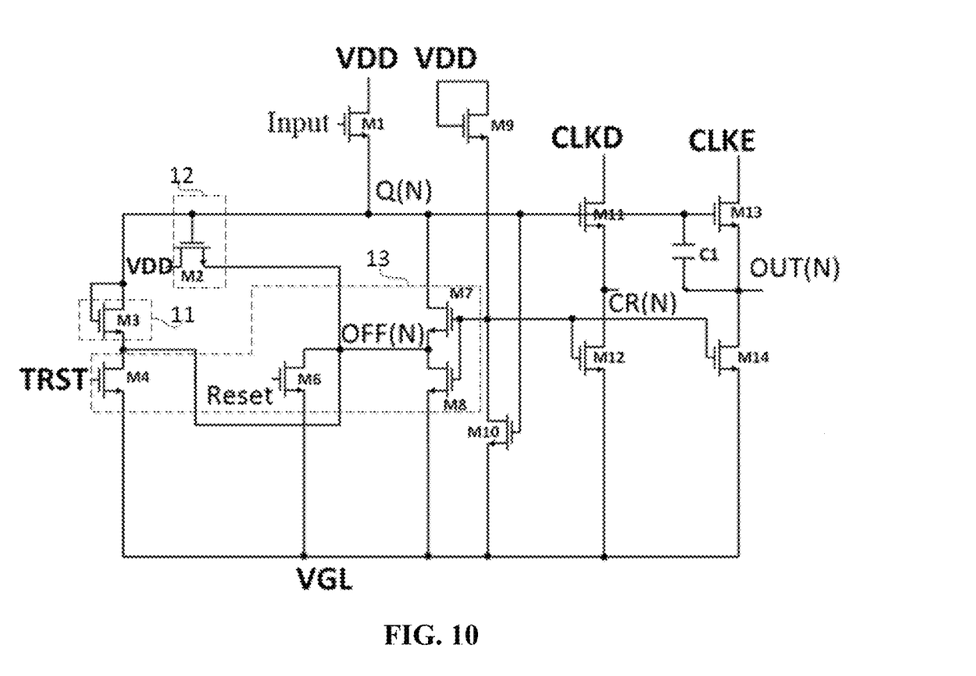
FIG. 10 is another circuit diagram of the shift register unit according to some embodiments of the present disclosure.

As shown in FIG. 10, the shift register unit in the embodiments of the present disclosure may include a first node connection branch 11, an ON/OFF control circuit 12, a third node control circuit 13, a first node control circuit 61, a second node control circuit 62, a storage capacitor C1, a gate driving signal output end OUT(N), a gate driving signal output circuit 63, a carry signal output end CR(N) and a carry signal output circuit 70. The first node connection branch 11 may include a first node connection transistor M3, a gate electrode and a drain electrode of which are electrically connected to the first node Q(N), and a source electrode of which is electrically connected to the third node OFF(N).

The ON/OFF control circuit 12 may include an ON/OFF control transistor M2, a gate electrode of which is electrically connected to the first node Q(N), a drain electrode of which is electrically connected to a high voltage end, and a source electrode of which is electrically connected to the third node OFF(N). The high voltage end is configured to apply a high voltage VDD.

The third node control circuit 13 may include a first control transistor M6, a second control transistor M8, a third control transistor M7 and an OFF control transistor M4. A gate electrode of the first control transistor M6 may be electrically connected to the reset end Reset, a drain electrode of the first control transistor M6 may be electrically connected to the third node OFF(N), and a source electrode of the first control transistor M6 may be electrically connected to a low voltage end which is configured to apply a low voltage VGL. A gate electrode of the second control transistor M8 may be electrically connected to the second node QB(N), a drain electrode of the second control transistor M8 may be electrically connected to the third node OFF(N), and a source electrode of the second control transistor M8 may be electrically connected to the low voltage end. A gate electrode of the third control transistor M7 may be electrically connected to the second node QB(N), a drain electrode of the third control transistor M7 may be electrically connected to the first node Q(N), and a source electrode of the third control transistor M7 may be electrically connected to the third node OFF(N). A gate electrode of the OFF control transistor M4 may be electrically connected to a frame resetting end TRST, a drain electrode of the OFF control transistor M4 may be electrically connected to third node OFF(N), and a source electrode of the OFF control transistor M4 may be electrically connected to the low voltage end.

The first node control circuit 61 may include a first node control transistor M1, the second node control circuit 62 may include a second node control transistor M10, and the gate driving signal output circuit 63 may include a first gate driving signal output transistor M13 and a second gate driving signal output transistor M14. A gate electrode of the first node control transistor M1 may be electrically connected to the input end Input, a drain electrode of the first node control transistor M1 may be electrically connected to the high voltage end, and a source electrode of the first node control transistor M1 may be electrically connected to the first node Q(N). A gate electrode of the second node control transistor M10 may be electrically connected to the first node Q(N), a drain electrode of the second node control transistor M10 may be electrically connected to the second node QB(N), and a source electrode of the second node control transistor M10 may be electrically connected to the low voltage end. A gate electrode of the first gate driving signal output transistor M13 may be electrically connected to the first node Q(N), a drain electrode of the first gate driving signal output transistor M13 may be electrically connected to the first clock signal end CLKE, and a source electrode of the first gate driving signal output transistor M13 may be electrically connected to the gate driving signal output end OUT(N). A gate electrode of the second gate driving signal output transistor M14 may be electrically connected to the second node QB(N), a drain electrode of the second gate driving signal output transistor M14 may be electrically connected to the gate driving signal output end OUT(N), and a source electrode of the second gate driving signal output transistor M14 may be electrically connected to the low voltage end.

The storage capacitor C1 may be connected between the first node Q(N) and the gate driving signal output end OUT(N).

The carry signal output circuit 70 may include a first carry signal output transistor M11 and a second carry signal output transistor M12. A gate electrode of the first carry signal output transistor M11 may be electrically connected to the first node Q(N), a drain electrode of the first carry signal output transistor M11 may be electrically connected to the second clock signal end CLKD, and a source electrode of the first carry signal output transistor M11 may be electrically connected to the carry signal output end CR(N). A gate electrode of the second carry signal output transistor M12 may be electrically connected to the second node QB(N), a drain electrode of the second carry signal output transistor M12 may be electrically connected to the carry signal output end CR(N), and a source electrode of the second carry signal output transistor M12 may be electrically connected to the low voltage end.

In the shift register unit in FIG. 10, all the transistors may be, but not limited to, N-type TFTs.

In the shift register unit in FIG. 10, the first node may be, but not limited to, a pull-up node, and the second node may be, but not limited to, a pull-down node.

In the shift register unit in FIG. 10, through M2 and M3, it is able to prevent the potential at Q(N) from being pulled down due to the current leakage, thereby to reduce the number of the transistors and provide a narrow bezel.

In the shift register unit in FIG. 10, Input may be electrically connected to an $(N-2)^{th}$-level carry signal output end CR(N-2), Reset may be electrically connected to an $(N+4)^{th}$-level carry signal output end CR(N+4), where N is a positive integer. When N is smaller than 3, Input may be electrically connected to a start end for applying a start signal.

The following description will be given when the shift register unit in FIG. 10 is a seventh-level shift register unit of a gate driving circuit, i.e., N=7.

As shown in FIG. 9, during the operation of the shift register unit in FIG. 10, a display period may include an input stage T1, an output stage T2, an output resetting stage T3, a resetting stage T4 and an output cutoff maintenance stage T5 arranged one after another.

At the input stage T1, a high level may be applied to CR(5), a low level may be applied to CR(11), and a low level may be applied to each of CLKD and CLKE. At this time, M1 may be turned on, so as to pull up a potential at Q(7) to a high level. M10 may be turned on, so as to pull down a potential at QB(7). M2 may be turned on, so as to enable the potential at OFF(N) to be a high level, and enable each of a potential at the source electrode of M3 and a potential at the drain electrode of M3 to be a high level, thereby to reduce a leakage current for M3 and maintain the potential at Q(7) to be a high level. M11 and M13 may be turned on, so as to control OUT(7) and CR(7) to each output a low level.

At the output stage T2, a low level may be applied to each of CR(5) and CR(11), and a high level may be applied to each of CLKD and CLKE. At this time, due to C1, the potential at Q(7) may be maintained as a high level. M11 and M13 may be turned on, so as to control OUT(7) and CR(7) to each output a high level.

At the output resetting stage T3, a low level may be applied to each of CR(5) and CR(11), and a low level may be applied to each of CLKD and CLKE. At this time, the potential at Q(N) may be maintained as a high level, and M11 and M13 may be turned on so as to control OUT(7) and CR(7) to each output a low level.

At the resetting stage T4, a low level may be applied to CR(5), and a high level may be applied to CR(11). At this time, M6 may be turned on, so as to control the potential at OFF(7) to be a low level. M3 may be turned on, so as to pull down the potential at Q(N) to a low voltage until M3 is turned off. M9 may be turned on and M10 may be turned off, so as to pull up the potential at QB(N). M11 and M13 may be turned off, and M12 and M14 may be turned on, so CR(7) and OUT(7) may each output a low level. M7 and M8 may be turned on, so as to maintain each of the potential at OFF(7) and the potential at Q(7) to be a low level.

At the output cutoff maintenance stage T5, a low level may be applied to CR(5), and a high level may be applied to CR(11). At this time, the potential at Q(7) may be maintained as a low level, and the potential at QB(7) may be maintained as a high level. M11 and M13 may be turned off, and M12 and M14 may be turned on, so CR(7) and OUT(7) may each output a low level. M7 and M8 may be turned on, so as to maintain the potential at OFF(7) and the potential at Q(7) as a low level.

The shift register unit in FIG. 10 differs from that in FIG. 8 in terms of the additional M7 for preventing the occurrence of a noise. During the operation of the shift register unit in FIG. 10, when a forward drift occurs for a threshold voltage of M3 and the potential at Q(N) decreases, the potential at Q(N) cannot be decreased to a sufficiently low degree due to a loss in the threshold voltage of M3. At this time, M7 may be turned on due to the potential at QB(N), so OFF(N) may be electrically connected to Q(N). Hence, It is able to sufficiently pull down the potential at Q(N), and improve the anti-noise capability.

The present disclosure further provides in some embodiments a method for driving the above-mentioned shift register unit, which includes, at an input stage and an output stage of a display device, controlling, by the first node connection branch, the first node to be electrically connected to the third node under the control of a potential at the first node, and controlling, by the ON/OFF control circuit, the third node to be electrically connected to the first voltage end under the control of the potential at the first node, so as to reduce a leakage current flowing through the first node connection branch.

According to the method in the embodiments of the present disclosure, through the first node connection branch and the ON/OFF control circuit, it is able to prevent the occurrence of current leakage through the ON/OFF control circuit, prevent the potential at the first node from being reduced, and maintain the potential at the first node as an active voltage in a better manner at the input stage and the output stage than conventional, thereby to output the gate driving signal normally. In addition, it is able to reduce the number of the transistors, thereby to provide a narrow bezel.

The present disclosure further provides in some embodiments a gate driving circuit including multi-levels of the above-mentioned shift register units.

The present disclosure further provides in some embodiments a display device including the above-mentioned gate driving circuit.

The display device may be any product or member having a display function, e.g., mobile phone, flat-panel computer, television, display device, lap-top computer, digital photo frame or navigator.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising a first node connection branch, an ON/OFF control circuit and a third node control circuit, wherein
   a first end of the first node connection branch is electrically connected to a first node, a second end of the first node connection branch is electrically connected to a third node, and the first node connection branch is configured to control the first node to be electrically connected to the third node under the control of a potential at the first node;
   the ON/OFF control circuit is electrically connected to the first node, the third node and a first voltage end, and configured to control the third node to be electrically connected to the first voltage end under the control of the potential at the first node; and
   wherein the third node control circuit is electrically connected to a resetting end, the third node and a second node, and configured to reset a potential at the third node under the control of a resetting signal from the resetting end and a potential at the second node.

2. The shift register unit according to claim 1, wherein the first node connection branch comprises a first node connection transistor, a control electrode and a first electrode of which are electrically connected to the first end of the first node connection branch, and a second electrode of which is electrically connected to the second end of the first node connection branch.

3. The shift register unit according to claim 1, wherein the ON/OFF control circuit comprises an ON/OFF control transistor, a control electrode of which is electrically connected to the first node, a first electrode of which is electrically connected to the first voltage end, and a second electrode of which is electrically connected to the third node.

4. The shift register unit according to claim 1, wherein the third node control circuit comprises a first control transistor and a second control transistor,
   a control electrode of the first control transistor is electrically connected to the resetting end, a first electrode of the first control transistor is electrically connected to the third node, and a second electrode of the first control transistor is electrically connected to a second voltage end;
   a control electrode of the second control transistor is electrically connected to the second node, a first electrode of the second control transistor is electrically connected to the third node, and a second electrode of the second control transistor is electrically connected to the second voltage end.

5. The shift register unit according to claim 1, wherein the third node control circuit comprises a first control transistor, a second control transistor and a third control transistor,
   wherein a control electrode of the first control transistor is electrically connected to the resetting end, a first electrode of the first control transistor is electrically connected to the third node, and a second electrode of the first control transistor is electrically connected to a second voltage end;
   a control electrode of the second control transistor is electrically connected to the second node, a first electrode of the second control transistor is electrically connected to the third node, and a second electrode of the second control transistor is electrically connected to the second voltage end; and
   a control electrode of the third control transistor is electrically connected to the second node, a first electrode of the third control transistor is electrically connected to the first node, and a second electrode of the third control transistor is electrically connected to the third node.

6. The shift register unit according to claim 1, wherein the third node control circuit comprises a first control transistor, a second control transistor and an OFF control transistor,
   wherein a control electrode of the first control transistor is electrically connected to the resetting end, a first electrode of the first control transistor is electrically connected to the third node, and a second electrode of the first control transistor is electrically Connected to a second voltage end;
   a control electrode of the second control transistor is electrically connected to the second node, a first electrode of the second control transistor is electrically connected to the third node, and a second electrode of the second control transistor is electrically connected to the second voltage end; and
   a control electrode of the OFF control transistor is electrically connected to a frame resetting end, a first electrode of the OFF control transistor is electrically connected to the third node, and a second electrode of the OFF control transistor is electrically connected to the second voltage end, wherein the third node control circuit is further configured to reset the potential at the third node under the control of a frame resetting signal from the frame resetting end.

7. The shift register unit according to claim 1, further comprising a first node control circuit, a second node control circuit, a storage capacitor, a gate driving signal output end and a gate driving signal output circuit,
wherein the first node control circuit is configured to control the potential at the first node under the control of an input signal from an input end;
the second node control circuit is configured to control the potential at the second node under the control of the potential at the first node;
the storage capacitor is connected between the first node and the gate driving signal output end; and
the gate driving signal output circuit is configured to control the gate driving signal output end to be electrically connected to a first clock signal end under the control of the potential at the first node and reset a gate driving signal outputted by the gate driving signal output end under the control of the potential at the second node.

8. The shift register unit according to claim 7, wherein the first node control circuit comprises a first node control transistor, the second node control circuit comprises a second node control transistor, and the gate driving signal output circuit comprises a first gate driving signal output transistor and a second gate driving signal output transistor,
a control electrode of the first node control transistor is electrically connected to the input end, a first electrode of the first node control transistor is electrically connected to a first voltage end, and a second electrode of the first node control transistor is electrically connected to the first node;
a control electrode of the second node control transistor is electrically connected to the first node, a first electrode of the second node control transistor is electrically connected to the second node, and a second electrode of the second node control transistor is electrically connected to a second voltage end;
a control electrode of the first gate driving signal output transistor is electrically connected to the first node, a first electrode of the first gate driving signal output transistor is electrically connected to the first clock signal end, and a second electrode of the first gate driving signal output transistor is electrically connected to the gate driving signal output end; and
a control electrode of the second gate driving signal output transistor is electrically connected to the second node, a first electrode of the second gate driving signal output transistor is electrically connected to the gate driving signal output end, and a second electrode of the second gate driving signal output transistor is electrically connected to the second voltage end.

9. The shift register unit according to claim 1, further comprising a carry signal output end and a carry signal output circuit,
wherein the carry signal output circuit is configured to control the carry signal output end to be electrically connected to a second clock signal end under the control of the potential at the first node and reset a carry signal outputted by the carry signal output end under the control of the potential at the second node.

10. The shift register unit according to claim 9, wherein the carry signal output circuit comprises a first carry signal output transistor and a second carry signal output transistor;
a control electrode of the first carry signal output transistor is electrically connected to the first node, a first electrode of the first carry signal output transistor is electrically connected to the second clock signal end, and a second electrode of the first carry signal output transistor is electrically connected to the carry signal output end; and
a control electrode of the second carry signal output transistor is electrically connected to the second node, a first electrode of the second carry signal output transistor is electrically connected to the carry signal output end, and a second electrode of the second carry signal output transistor is electrically connected to the second voltage end.

11. A method for driving the shift register unit according to claim 1, comprising:
at an input stage and an output stage of a display device, controlling, by the first node connection branch, the first node to be electrically connected to the third node under the control of a potential at the first node, and controlling, by the ON/OFF control circuit, the third node to be electrically connected to the first voltage end under the control of the potential at the first node.

12. A gate driving circuit, comprising the shift register unit according to claim 1.

13. A display device, comprising the gate driving circuit according to claim 12.

14. The shift register unit according to claim 1, wherein the first node connection branch comprises a first node connection transistor;
the third node control circuit comprises a first control transistor, a second control transistor and a third control transistor; and
the ON/OFF control circuit comprises an ON/OFF control transistor.

15. The shift register unit according to claim 14, wherein the first node connection transistor, the first control transistor, the second control transistor, the third control transistor, and the ON/OFF control transistor are all N-type transistors.

16. The shift register unit according to claim 15, wherein the first node is a pull-up node, and the second node is a pull-down node.

17. The shift register unit according to claim 15, wherein the first voltage end is a voltage end with a high-voltage.

18. The shift register unit according to claim 1, wherein the first node connection branch comprises a first node connection transistor, a control electrode and a first electrode of which are electrically connected to the first end of the first node connection branch, and a second electrode of which is electrically connected to the second end of the first node connection branch,
wherein the ON/OFF control circuit comprises an ON/OFF control transistor, a control electrode of which is electrically connected to the first node, a first electrode of which is electrically connected to the first voltage end, and a second electrode of which is electrically connected to the third node,
wherein the third node control circuit comprises a first control transistor, a second control transistor and a third control transistor,
wherein a control electrode of the first control transistor is electrically connected to the resetting end, a first electrode of the first control transistor is electrically connected to the third node, and a second electrode of the first control transistor is electrically connected to a second voltage end;

a control electrode of the second control transistor is electrically connected to the second node, a first electrode of the second control transistor is electrically connected to the third node, and a second electrode of the second control transistor is electrically connected to the second voltage end; and a control electrode of the third control transistor is electrically connected to the second node, a first electrode of the third control transistor is electrically connected to the first node, and a second electrode of the third control transistor is electrically connected to the third node, wherein the shift register unit further comprises a first node control circuit, a second node control circuit, a storage capacitor, a gate driving signal output end and a gate driving signal output circuit, wherein the first node control circuit is configured to control the potential at the first node under the control of an input signal from an input end;

the second node control circuit is configured to control the potential at the second node under the control of the potential at the first node;

the storage capacitor is connected between the first node and the gate driving signal output end; and the gate driving signal output circuit is configured to control the gate driving signal output end to be electrically connected to a first clock signal end under the control of the potential at the first node and reset a gate driving signal outputted by the gate driving signal output end under the control of the potential at the second node, wherein the shift register unit further comprises a carry signal output end and a carry signal output circuit, wherein the carry signal output circuit is configured to control the carry signal output end to be electrically connected to a second clock signal end under the control of the potential at the first node and reset a carry signal outputted by the carry signal output end under the control of the potential at the second node, wherein the first node control circuit comprises a first node control transistor, the second node control circuit comprises a second node control transistor, and the gate driving signal output circuit comprises a first gate driving signal output transistor and a second gate driving signal output transistor;

a control electrode of the first node control transistor is electrically connected to the input end, a first electrode of the first node control transistor is electrically connected to a first voltage end, and a second electrode of the first node control transistor is electrically connected to the first node;

a control electrode of the second node control transistor is electrically connected to the first node, a first electrode of the second node control transistor is electrically connected to the second node, and a second electrode of the second node control transistor is electrically connected to a second voltage end;

a control electrode of the first gate driving signal output transistor is electrically connected to the first node, a first electrode of the first gate driving signal output transistor is electrically connected to the first clock signal end, and a second electrode of the first gate driving signal output transistor is electrically connected to the gate driving signal output end; and a control electrode of the second gate driving signal output transistor is electrically connected to the second node, a first electrode of the second gate driving signal output transistor is electrically connected to the gate driving signal output end, and a second electrode of the second gate driving signal output transistor is electrically connected to the second voltage end, wherein the carry signal output circuit comprises a first carry signal output transistor and a second carry signal output transistor;

a control electrode of the first carry signal output transistor is electrically connected to the first node, a first electrode of the first carry signal output transistor is electrically connected to the second clock signal end, and a second electrode of the first carry signal output transistor is electrically connected to the carry signal output end; and a control electrode of the second carry signal output transistor is electrically connected to the second node, a first electrode of the second carry signal output transistor is electrically connected to the carry signal output end, and a second electrode of the second carry signal output transistor is electrically connected to the second voltage end.

19. The shift register unit according to claim 18, wherein the first node connection transistor, the first control transistor, the second control transistor, the third control transistor, the ON/OFF control transistor, the first node control transistor, the second node control transistor, the first gate driving signal output transistor, the second gate driving signal output transistor, the first carry signal output transistor and the second carry signal output transistor are all N-type transistors.

20. The shift register unit according to claim 18, wherein the first node is a pull-up node, and the second node is a pull-down node; and wherein the first voltage end is a voltage end with a high-voltage.

* * * * *